(12) United States Patent
Mazur et al.

(10) Patent No.: US 8,895,839 B2
(45) Date of Patent: Nov. 25, 2014

(54) MULTIJUNCTION PHOTOVOLTAIC DEVICE

(75) Inventors: Eric Mazur, Concord, MA (US); Mark Winkler, Brooklyn, NY (US); Brian R. Tull, West New York, NJ (US)

(73) Assignee: President And Fellows of Harvard College, Cambridge, MA (US)

( * ) Notice: Subject to any disclaimer, the term of this patent is extended or adjusted under 35 U.S.C. 154(b) by 971 days.

(21) Appl. No.: 12/864,994

(22) PCT Filed: Feb. 2, 2009

(86) PCT No.: PCT/US2009/032871
§ 371 (c)(1),
(2), (4) Date: Nov. 24, 2010

(87) PCT Pub. No.: WO2009/100023
PCT Pub. Date: Aug. 13, 2009

(65) Prior Publication Data
US 2011/0100441 A1 May 5, 2011

Related U.S. Application Data

(60) Provisional application No. 61/025,499, filed on Feb. 1, 2008, provisional application No. 61/053,080, filed on May 14, 2008.

(51) Int. Cl.
*H01L 31/06* (2012.01)
(Continued)

(52) U.S. Cl.
CPC ........... *H01L 31/076* (2013.01); *H01L 31/0236* (2013.01); *H01L 31/1872* (2013.01);
(Continued)

(58) Field of Classification Search
CPC ............ H01L 31/0725; H01L 31/0747; H01L 31/076; H01L 31/02167; H01L 31/0236; H01L 31/02363; H01L 31/186; H01L 31/1872; Y02E 10/52; Y02E 10/548
USPC ............................................. 136/255; 438/57
See application file for complete search history.

(56) References Cited

U.S. PATENT DOCUMENTS 5,507,881 A 4/1996 Sichanugrist et al.
6,653,554 B2 * 11/2003 Ishihara ........................ 136/258
(Continued)

FOREIGN PATENT DOCUMENTS

JP 06267868 A 9/1994
JP 2001007381 A 1/2001
JP 2002-043594 A 2/2002

OTHER PUBLICATIONS

Stalmans et al., Porous silicon in crystalline silicon solar cells: A review and the effect on the internal quantum efficiency. Progress in Photovoltaics 6, 233-246 (1998).

(Continued)

*Primary Examiner* — Matthew Martin
(74) *Attorney, Agent, or Firm* — Reza Mollaaghababa; Thomas Engellenner; Pepper Hamilton LLP

(57) ABSTRACT

Photovoltaic devices (e.g., solar cells) are disclosed that include at least three radiation absorbing layers, each capable of absorbing radiation over a different wavelength range of the solar radiation spectrum. Any two of these three wavelength ranges can be partially overlapping, or alternatively they can be distinct. The layers are disposed relative to one another so as to form two junctions, each of which includes a depletion region. In some cases, the radiation absorbing layers can collectively absorb radiation over a wavelength range that spans at least about 60%, or 70%, or 80%, and preferably 90% of the solar radiation wavelength spectrum. By way of example, in some embodiments, one layer can exhibit significant absorption of solar radiation (e.g., it can absorb at least one radiation wavelength at an absorptance greater than about 90%) at wavelengths less than about 0.7 microns while another layer can exhibit significant absorption of the solar radiation at wavelengths in a range of about 0.7 microns to about 1 micron. The third layer can in turn exhibit a significant absorption of solar radiation at wavelengths greater than about 1 micron.

44 Claims, 8 Drawing Sheets

(51) Int. Cl.
   H01L 31/18     (2006.01)
   H01L 31/076    (2012.01)
   H01L 31/0725   (2012.01)
   H01L 31/0747   (2012.01)
   H01L 31/0236   (2006.01)
   H01L 31/0216   (2014.01)

(52) U.S. Cl.
   CPC ......... *H01L 31/186* (2013.01); *H01L 31/02363* (2013.01); *H01L 31/02167* (2013.01); *H01L 31/0725* (2013.01); *H01L 31/0747* (2013.01); *Y02E 10/52* (2013.01); *Y02E 10/548* (2013.01)
   USPC .......................................... 136/255; 438/57

(56) References Cited

U.S. PATENT DOCUMENTS

| | | | |
|---|---|---|---|
| 7,057,256 | B2 | 6/2006 | Carey, III et al. |
| 7,816,220 | B2 | 10/2010 | Mazur et al. |
| 2003/0029495 | A1 | 2/2003 | Mazur et al. |
| 2003/0183270 | A1* | 10/2003 | Falk et al. ...................... 136/258 |
| 2005/0127401 | A1* | 6/2005 | Mazur et al. .................. 257/200 |
| 2006/0079062 | A1 | 4/2006 | Mazur et al. |
| 2007/0131275 | A1* | 6/2007 | Kinsey et al. ................. 136/255 |
| 2008/0044943 | A1 | 2/2008 | Mazur et al. |

OTHER PUBLICATIONS

Stocks et al., Texturing ofpolycrystalline silicon. Solar Energy Materials and Solar Cells 40, 33-42 (1996).
Stupca et al., Enhancement of polycrystalline silicon solar cells using ultrathin films of silicon nanoparticle. Applied Physics Letters 91, 063107 (2007).
"Svrcek et al., Ex situ prepared Si nanocrystals embedded in silica glass: Formation and characterization. Journal of Applied Physics 95, 3158-3163 (2004)."
Svrcek et al., Silicon nanocrystals as light converter for solar cells. Thin Solid Films 451-52, 384-388 (2004).
Tiwari et al., A silicon nanocrystals based memory. Applied Physics Letters 68, 1377-1379 (1996).
Torres et al., Device grade microcrystalline silicon owing to reduced oxygen contamination, Applied Physics Letters 69, 1373-1375 (1996).
Tull et al., Formation of silicon nanoparticles and web-like aggregates by femtosecond laser ablation in a background gas. Applied Physics a-Materials Science & Processing 83, 341-346 (2006).
Tull et al., Silicon surface morphologies after femtosecond laser irradiation, Mrs Bulletin 31, 626-633 (2006).
Wilson et al., Quantum Confinement in Size-Selected, Surface-Oxidized Silicon Nanocrystals. Science 262, 1242-1244 (1993).
"Wronski, Electronic Properties of Amorphous Silicon in Solar-Cell Operation Ieee Transactions on Electron Devices 24, 351-357 (1977)".
Wu et al., 13.9%efficient CdTe polycrystalline thin-film solar cells with an infrared transmission of similar to so%, Progress in Photovoltaics 14, 471-483 (2006).
Yablonovitch et al., Intensity Enhancement in Textured Optical Sheets for Solar-Cells. Ieee Transactions on Electron Devices 29, 300-305 (1982).
Yu et al., Polymer Photovoltaic CellsEnhanced Efficiencies Via a Network ofInternal Donor-Acceptor Heterojunctions. Science 270, 1789-1791 (1995).
Zhao et al., 19.8% efficient "honeycomb" textured multicrystalline and 24.4% monocrystalline silicon solar cells. Applied Physics Letters 73, 1991-1993 (1998).
International Preliminary Report on Patentability and Written Opinion for International Application No. PCT/US/2009/032871 dated Aug. 3, 2010.
International Search Report and Written Opinion for Application No. PCT/US2009/032871 issued Sep. 14, 2009.

Her et al., Microstructuring of silicon with femtosecond laser pulses. Appl. Phys. Lett. 73, 1673-5 (1998).
Tull, Femtosecond laser ablation of silivon: nanoparticles, doping and photovoltaics. Thesis, Harvard University. Cambridge, MA 2007. 174 pages.
Wu et al., Near-unity below-band-gap absorption by microstructured silicon. Appl. Phys. Lett. 78, 1850-2 (2001).
"Aberle, Progress with polycrystalline silicon thin-film solar cells on glass at UNSW. Journal of Crystal Growth 287,386-390 (2006)."
Amoruso et al., Emission of nanoparticles during ultrashort laser irradiation of silicon targets. Europhysics Letters 67, 404-410 (2004).
Arango et al., Charge transfer in photovoltaics consisting of interpenetrating networks of conjugated polymer and Ti02 nanoparticles. Applied Physics Letters 74, 1698-1700 (1999).
Beek et al., Efficient hybrid solar cells from zinc oxide nanoparticles and a conjugated polymer. Advanced Materials 16, 1009-1013 (2004).
"Blood et al., Electrical Characterization of Semiconductors. Reports on Progress in Physics 41, 157-257 (1978).".
Brus, Luminescence of Silicon Materials—Chains, Sheets, Nanocrystals, Nanowires, Microcrystals, and Porous Silicon. Journal of Physical Chemistry 98,3575-3581 (1994).
Bucksbaum et al., Rapid Melting and Regrowth Velocities in Silicon Heated by Ultraviolet Picosecond Laser-Pulses, Physical Review Letters 53, 182-185 (1984).
"Bulgakov et al., Silicon clusters produced by femtosecond laser ablation: non-thermal emission and gas-phase condensation. Applied Physics AMaterials Science & Processing 79, 1591-1594 (2004)."
Campbell et al., Light Trapping Properties of Pyramidally Textured Surfaces. Journal of Applied Physics 62, 243-249 (1987).
Carey et al., Visible and near-infared responsivity of femtosecond-laser microstructured silicon photodiodes. Opt. Lett. 2005;30:1773-5.
Carey, Femtosecond-laser microstructuring of silicon for novel optoelectronic devices. Thesis. The Division of Engineering and Applied Sciences. Harvard University. Cambridge, MA. Jul. 2004 162 pages.
Cifre, Polycrystalline Silicon Films Obtained by Hot-Wire Chemical-Vapor-Deposition. Applied Physics aMaterials Science & Processing 59, 645-651 (1994).
Contreras et al., Progress toward 20% efficiency in Cu(In,Ca)Se-2 polycrystalline thin-film solar cells. Progress in Photovoltaics 7, 311-316 (1999).
Cuadra et al., Present status of intermediate band solar cell research. Thin Solid Films 451-52, 593-599 (2004).
Curtins et al., High-Rate Deposition of Amorphous Hydrogenated Silicon—Effect of Plasma Excitation-Frequency. Electronics Letters 23, 228-230 (1987).
Delley et al., Quantum Confinement in Si Nanocrystals. Physical Review B 47, 1397-1400 (1993).
Glezer et al., Ultrafast-laser driven micro-explosions in transparent materials. Applied Physics Letters 71, 882-884 (1997).
Glover et al., Probing particle synthesis during femtosecond laser ablation: initial phase transition kinetics. Applied Physics B Lasers and Optics 78, 995-1000 (2004).
"Glover, Hydrodynamics of particle formation following femtosecond laser ablation. Journal of the Optical Society of America B-Optical Physics 20, 125-131 (2003)".
Goetzbergeret al., Crystalline Silicon Solar Cells (ed.), Chapter 6, High Efficiency Solar Cells. New York: John Wiley & Sons Ltd, 1994.
Goetzbergeret al., Crystalline Silicon Solar Cells (ed.), Chapter 7, High Efficiency Solar Cells. New York: John Wiley & Sons Ltd, 1994.
Goetzbergeret al., Crystalline Silicon Solar Cells (ed.), Chapter 8, High Efficiency Solar Cells. New York: John Wiley & Sons Ltd, 1994.
Green, Recent developments in photovoltaics. Solar Energy 76, 3-8 (2004).
Greenham et al.,Charge separation and transport in conjugated-polymerjsemiconductor-nanocrystal composites studied by photoluminescence quenching and photoconductivity. Physical Review B 54, 17628-17637 (1996).
Halls et al., Efficient Photodiodes from Interpenetrating Polymer Networks. Nature 376, 498-500 (1995).

(56) References Cited

OTHER PUBLICATIONS

Heisterkamp et al., Pulse energy dependence of subcellular dissection by femtosecond laser pulses. Optics Express 13, 3690-3696 (2005).
Henry, Limiting Efficiencies of Ideal Single and Multiple Energy-Gap Terrestrial Solar-Cells. Journal of Applied Physics 51, 4494-4500 (1980).
Huang et al., Microstructured silicon photodetector. Applied Physics Letters 89 (2006).
"Keppner et al., Passivation Properties of Amorphous and Microcrystalline Silicon Layers Deposited by Vhf-Gd for Crystalline Silicon Solar-Cells. Solar Energy Materials and Solar Cells 34, 201-209 (1994)".
"Luque et al., Increasing the efficiency of ideal solar cells by photon induced transitions at intermediate levels. Physical Review Letters 78, 5014-5017 (1997)."
"Marti et al., Limiting efficiencies for photovoltaic energy conversion in multigap systems. Solar Energy Materials and Solar Cells 43, 203-222 (1996)."
Meier et al., Complete Microcrystalline P-1-N. SolarCell-Crystalline or Amorphous Cell Behavior. Applied Physics Letters 65, 860-862 (1994).
Meier et al., Recent progress in micromorph solar cells. Journal of Non-Crystalline Solids 230, 1250-1256 (1998).
Mo et al., Sulfur point defects in crystalline and amorphous silicon. Physical Review B 70 (2004).
Myers et al., Enhancing nearinfrared avalanche photodiode performance by femtosecond laser microstructuring. Applied Optics 45, 8825-8831 (2006).
"Nirmal et al., Luminescence photophysics in semiconductor nanocrystals. Accounts of Chemical Research 32, 407-414 (1999)".
"O'Regan et al., A Low-Cost, High-Efficiency Solar-Cell Based on DyeSensitized Colloidal Tio2 Films. Nature 353, 737-740 (1991).".
Pavesi, Optical gain in silicon nanocrystals. Nature 408, 440-444 (2000).
Rath et al., Limited influence of grain boundary defects in hot-wire CVD polysilicon films on solar cell performance. Journal of Non-Crystalline Solids 230, 1277-1281 (1998).
Reber et al., Crystalline silicon thin-film solar cellsrecent results at Fraunhofer ISE, Solar Energy 77, 865-875 (2004).
Schaffer et al., Micromachining bulk glass by use offemtosecond laser pulses with nanojoule energy. Optics Letters 26, 93-95 (2001).
"Schuppler et al., Size, Shape, and Composition of Luminescent Species in Oxidized Si Nanocrystals and H-Passivated Porous Si. Physical Review B 52, 4910-4925 (1995)".
"Seto, Electrical Properties of Polycrystalline Silicon Films. Journal of Applied Physics 46, 5247-5254 (1975).".
"Shah et al., Thin-film silicon solar cell technology. Progress in Photovoltaics 12, 113-142 (2004).".
Sheehy et al., Chalcogen doping of silicon via intense femtosecond-laser irradiation. Materials Science and Engineering B-Solid State Materials for Advanced Technology 137, 289-294 (2007).
Sheehy et al., Role of the Background Gas in the Morphology and Optical Properties of Laser-Microstructured Silicon. Chem Mater. 2005;17(14):3582-6.
"Shockley et al., Detailed Balance Limit of Efficiency of p-n Junction Solar Cells. Journal of Applied Physics 32,510-519 (1961)."
Sipe et al., Laser-Induced Periodic Surface-Structure .1. Theory. Physical Review B 27, 1141-1154 (1983).
Slaoui et al., Advanced inorganic materials for photovoltaics. Mrs Bulletin 32, 211-218 (2007).
Staebler et al., Stability of N-I-P. Amorphous-Silicon Solar-Cells. Applied Physics Letters 39, 733-735 (1981).

* cited by examiner

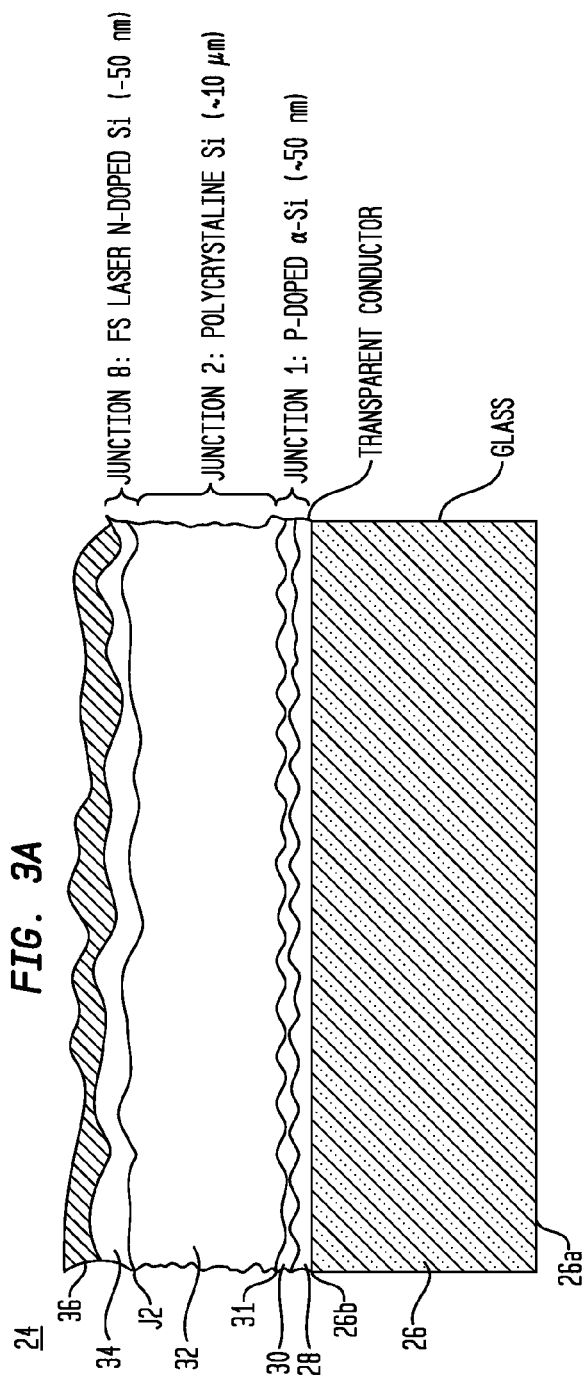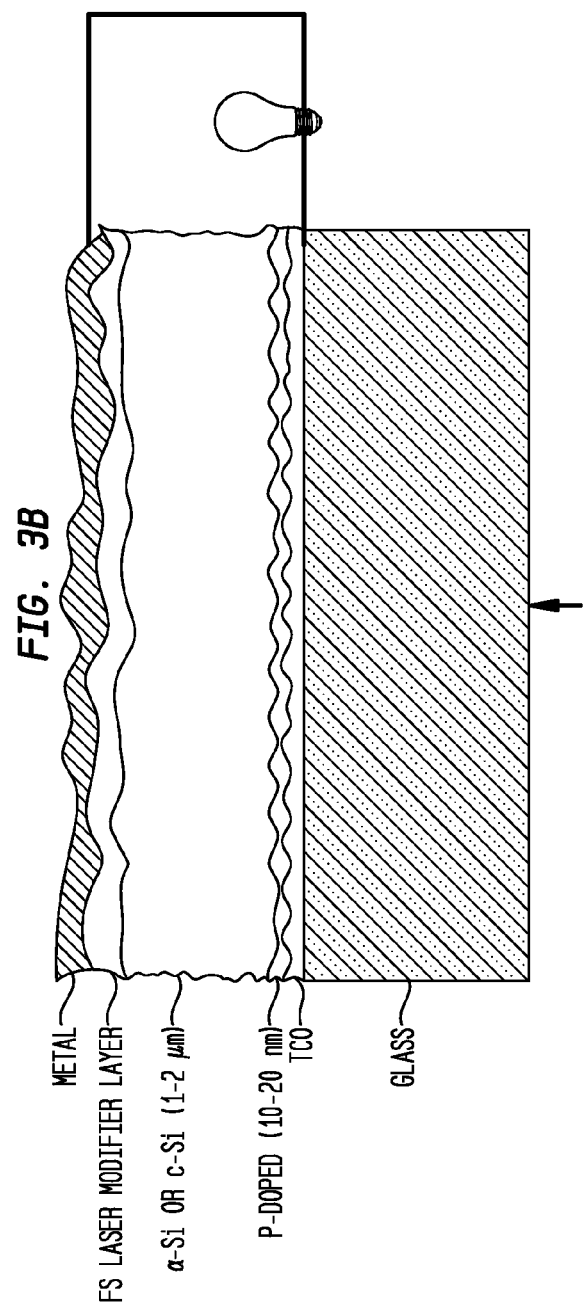
FIG. 3A
FIG. 3B

MULTIJUNCTION PHOTOVOLTAIC DEVICE

RELATED APPLICATION

The present application claims priority to provisional application entitled "All Silicon Multijunction Photovoltaic (Solar Cell)" filed on Feb. 1, 2008 and having a Ser. No. 61/025,499 as well as provisional application entitled "A Multijunction Photovoltaic Device" filed on May 14, 2008 and having a Ser. No. 61/053,080. Both of these provisional applications are herein incorporated by reference.

FEDERALLY SPONSORED RESEARCH

This invention was made with Government support under the National Science Foundation awards ECS0601520 and PHY0646094. The Government has certain rights in the invention.

BACKGROUND

The present invention relates generally to photovoltaic devices and methods for their fabrication.

Photovoltaic devices produce electric power via conversion of the planet's most abundant and renewable energy input: sunlight. Crystalline silicon solar cells are among the most mature and efficient photovoltaic technologies. Additionally, silicon is the second most abundant element in the earth's crust. Although silicon would seem as the premier candidate for renewable and environmentally friendly solar energy conversion, high manufacturing costs and a recent shortage of device grade silicon have prevented such cells from economically competing with the combustion of fossil fuels as a source of electricity on a large scale.

Hence, there is a need for enhanced photovoltaic devices as well as improved fabrication techniques, particularly as they relate to enhanced silicon photovoltaic cells.

SUMMARY

Photovoltaic devices (e.g., solar cells) are disclosed that include at least three radiation absorbing layers, each capable of absorbing radiation over a different wavelength range of the solar radiation spectrum. Any two of these three wavelength ranges can be partially overlapping, or alternatively they can be distinct from each other. The layers are disposed relative to one another so as to form two junctions, each of which includes a depletion region. In some cases, the radiation absorbing layers can collectively absorb radiation over a wavelength range that spans at least about 60%, or about 70%, or about 80%, and preferably at least about 90% of the solar radiation wavelength spectrum. By way of example, in some embodiments, one layer can exhibit significant absorption of solar radiation (e.g., it can absorb at least one radiation wavelength at an absorptance greater than about 90%) at wavelengths less than about 0.7 microns while another layer can exhibit significant absorption of the solar radiation at wavelengths in a range of about 0.7 microns to about 1 micron. The third layer can in turn exhibit a significant absorption of solar radiation at wavelengths greater than about 1 micron.

In a related aspect, the photovoltaic device is configured such that at least a portion of a surface of one of the layers can be exposed to the solar radiation. In many embodiments, the layer that is capable of absorbing high energy photons (shorter wavelengths) is the first layer that receives the radiation. A portion of the radiation is absorbed by that layer and the remaining radiation passes through the other two layers, each of which in turn absorbs a portion of the radiation corresponding to its wavelength absorption range. The absorption of the solar radiation can generate electron-hole pairs. At least some of such electron-hole pairs can be separated under the influence of the electric fields present in the depletion regions associated with the junctions between the layers so as to generate a voltage across the device.

In some embodiments, the radiation absorbing layers can collectively absorb at least about 60%, or at least about 70%, or at least about 80%, or at least about 90%, of solar radiation incident on a portion of at least one of the layers that is adapted for exposure to solar radiation.

Two electrically conductive electrodes, one of which is electrically coupled to the upper layer and the other to the lower layer, can be employed to apply the voltage generated across the device, in response to exposure to the solar radiation, to an external load. By way of example, in some embodiments, the photovoltaic device includes a radiation transparent substrate (e.g., a substrate that allows the passage of at least about 50% of incident solar radiation) on which the radiation absorbing layers are disposed. Although the term substrate is used it should be appreciated that, in a typical embodiment, the substrate will be the uppermost element of the device, upon which the solar radiation impinges. A radiation transparent electrically conductive layer (e.g., a layer formed of indium tin oxide or zinc oxide) disposed between the electrically conductive transparent layer and the upper layer, which is in electrical contact with at least a portion of the upper layer, forms one of the electrodes. The other electrode can be formed by a metallic layer disposed over at least a portion of the lower layer so as to form an electrical contact therewith.

As noted above, at least a portion of the electron-hole pairs generated in response to the exposure of the radiation absorbing layers to solar radiation can drift in opposite directions under the influence of the electric fields in the depletion regions to generate a voltage across the electrodes, which can be applied to an external load.

In a related aspect, the various layers of the above photovoltaic device can be formed of silicon doped with a suitable dopant. By way of example, in some cases, the upper layer includes a p-doped layer of amorphous silicon (e.g., a layer having a thickness in a range of about 10 nanometers (nm) to about 500 nm) while the intermediate layer includes an n-doped layer of crystalline or polycrystalline silicon (e.g. a layer having a thickness in a range of about 5 $\mu M$ (microns) to about 50 $\mu m$). The lower layer can include a thin layer of highly doped silicon that includes a high concentration of an n-type dopant (e.g., an atomic concentration of at least about 0.1%, e.g., in a range of about 0.1% to about 2%) that can absorb radiation wavelengths greater than about 1 micron (or 1.1 microns corresponding to the band gap of crystalline silicon) with a high absorptance (e.g., greater than about 50%, and preferably greater than about 90%) to generate electron-hole pairs.

In another aspect, the invention provides a photovoltaic device (e.g., a solar cell), which comprises a first semiconductor layer capable of absorbing radiation at wavelengths greater than about 1 micron with an absorptance greater than about 60% for at least one of those wavelengths, and a second semiconductor layer capable of absorbing radiation at one or more wavelengths in a range of about 0.7 microns to about 1 micron, where the second layer forms a junction with the first layer. The photovoltaic device can further include a third semiconductor layer that is capable of absorbing radiation at wavelengths less than about 0.7 microns, e.g., in a range of about 0.25 microns to about 0.7 microns, where the third layer forms a junction with said second layer. Each junction can comprise a depletion region in which an electric field is present.

In another aspect, a method of fabricating a photovoltaic device is disclosed that includes forming a radiation transparent conductive layer, which can function as an electrode, over a surface of a radiation transparent substrate. A layer of amorphous silicon doped with a p-type dopant can then be formed, e.g., via plasma enhanced chemical vapor deposition, over the transparent conductive layer. A layer of crystalline or polycrystalline silicon can then be formed over the amorphous layer, e.g., via low pressure chemical vapor deposition. A plurality of short laser pulses (e.g., pulses having temporal durations in a range of about 100 femtoseconds to about 500 femtoseconds) can be applied to an exposed surface of the crystalline or polycrystalline layer (that is a surface opposed to the one that is in contact with the amorphous layer) while exposing the surface to a fluid (e.g., a liquid or gas) having an electron-donating constituent to form a thin highly doped surface layer (e.g., one having a thickness in a range of about 10 nm to about 1000 nm) that functions as another radiation absorbing layer of the cell. Subsequently, a metallic layer can be deposited over the disordered layer (e.g., by evaporating a metal onto a top surface of the disordered layer) so as to generate another electrode. The highly doped layer, which can in some cases be a crystalline or polycrystalline layer, can also be formed to have these high doping levels using other techniques that yield similar optical properties. These techniques include irradiating with a plurality of short laser pulses having longer durations, e.g., as long as 1 picosecond, or even as long as 1 nanosecond, to about 100 nanoseconds. Other techniques to implant large quantities of dopants can also be used.

Further understanding of the invention can be obtained by reference to the following detailed description in conjunction with the associated drawings, which are discussed briefly below.

DETAILED DESCRIPTION

The present invention generally provides a multi-junction photovoltaic device (e.g., a solar cell) that can include, e.g., a first, a second and a third radiation absorbing layer, each capable of absorbing radiation over a different wavelength range within the solar wavelength spectrum. The first and the second layer can have, respectively, p-type and n-type doping (or vice versa) and can contact one another, e.g., along a surface, to form a junction characterized by a depletion region. In some cases, the third layer can have the same type of doping as that of the second layer (e.g., both the second layer and the third layer can have an n-type doping) but at a different (e.g., higher) concentration level (e.g., at least about 1% atomic), or it can have a different type of doping, such that a junction it forms with the intermediate layer would also include a depletion region. The term "depletion region," also commonly known as "depletion layer" or "depletion zone," is known in the art and can be formed across a junction between two semiconductors (e.g., a p-n junction) having different concentrations of electrons or holes via diffusion of carriers from the semiconductor having a higher concentration to the other until an electric field generated across the junction impedes the diffusion, thus leading to the formation of a region that is substantially lacking in mobile charge carriers and supports an electric field.

Figure 1:
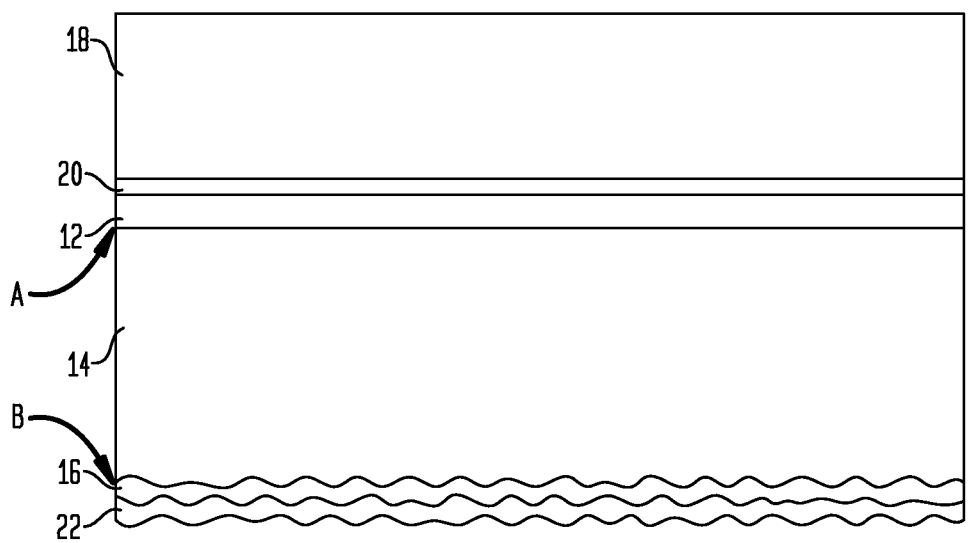
FIG. 1 schematically depicts a photovoltaic cell in accordance with one embodiment of the invention.

FIG. 1 schematically depicts a multijunction photovoltaic device 10, e.g., a solar cell, that includes three radiation absorbing layers (regions) 12, 14, and 16 that are disposed relative to one another to form two junctions A and B. For ease of description, the layers 12, 14, and 16 are herein referred to in some cases, respectively, as the upper (first), intermediate (second) and lower (third) layers. Each layer is formed of a material, e.g., a semiconductor, in which electron-hole pairs can be generated in response to the absorption of optical radiation having suitable wavelengths. The layers are disposed on a support substrate 18, which can be formed of a suitable radiation transparent material such as glass. In many embodiments, the substrate 18 can allow the passage of at least about 50% of the sun's radiation, and preferably at least about 80% and more preferably at least about 90% of the incident sun's radiation. A radiation transparent electrically conducting layer 20, which functions as one of two electrodes for coupling a voltage generated across the cell in response to solar radiation to an external load, separates the radiation absorbing layer 12 from the support substrate 18 and forms electrical contact with that absorbing layer.

A metallic layer 22 disposed over the lower layer 16 provides another electrode that in combination with the electrode 16 can be utilized to apply a voltage generated across the device to an external load (not shown). As discussed in more detail below, upon exposure of the layers 12, 14 and 16 to solar radiation, electron-hole pairs can be generated in those layers. At least a portion of these electron-hole pairs can be separated under the influence of the electric fields associated with the junctions A and B to drift in opposite directions toward the electrode 20 or 22. In this manner, a voltage can be generated across the device.

By way of example, in some implementations of the multijunction solar cell 10, each of the radiation absorbing layers 12, 14 and 16 can show a significant absorption, e.g., an absorption greater than about 60% (e.g., in a range of about 60% to about 100%), for radiation in a different wavelength band of the solar radiation spectrum. In some cases, such wavelength bands can have overlapping portions and can collectively cover the wavelengths of the sun's radiation not only in the visible wavelength range but also in the infrared range. For example, the layers can be collectively capable of absorbing all radiation wavelengths over a span of the sun's radiation spectrum extending from about 250 nm to about 2500 nm.

The sun's radiation spectrum exhibits wavelengths that span a range of about 0.25 microns to about 2.5 microns, with significant decrease in intensity for wavelengths beyond this range. Accordingly, the term "solar wavelength spectrum," as used herein can refer to a wavelength range extending from about 0.25 microns to about 2.5 microns.

The solar spectrum can be approximated by that of a black body radiating at a temperature of about 5900 K. The spectral irradiance, M, emitted by a black body in the units of $Wm^{-2}$ µm is given by:

$$M = \frac{2\pi hc^2}{\lambda^5} \frac{1}{\exp\left[\frac{hc}{kT\lambda}\right] - 1} \quad \text{Eq. (1)}$$

where h is Planck's constant, c is the speed of light, k is the Boltzmann constant, T is the temperature of the black body in units of Kelvin (K) and λ is the wavelength in units of microns (µm).

Figure 2:
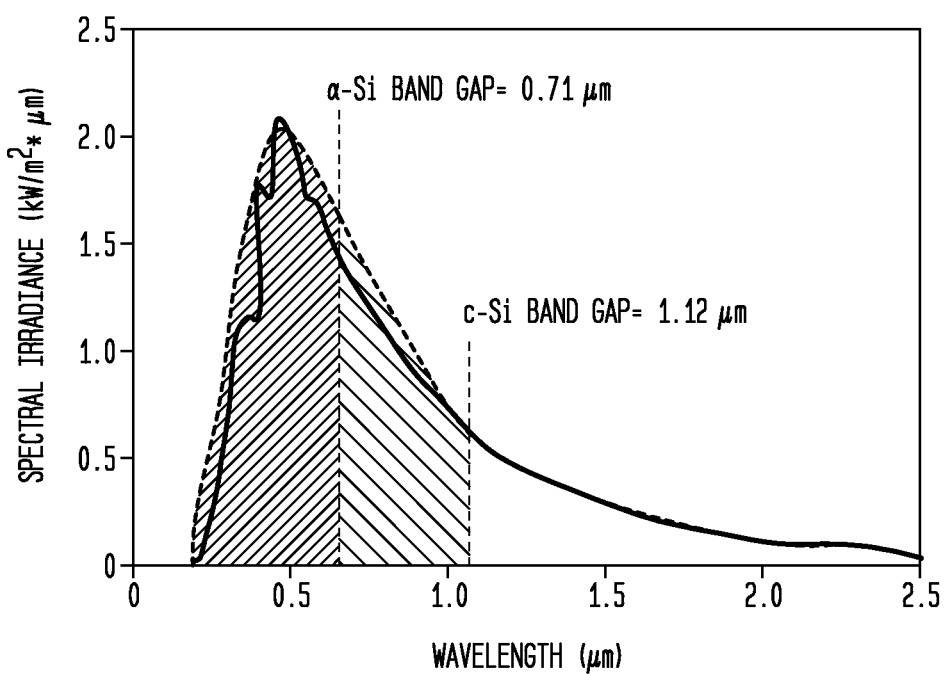
FIG. 2 shows the spectral irradiance of solar radiation as a function of wavelength at the earth above the atmosphere (solid line) relative to radiation from a black body at a temperature of about 5900 K (dashed line), FIG. 3A schematically depicts an exemplary implementation of the photovoltaic cell of FIG. 1, FIG. 3B schematically depicts the photovoltaic cell of FIG. 3A attached to a load.

By way of example, FIG. 2 shows a solar radiation spectrum indicating solar radiation irradiance as a function of the radiation wavelength. In some implementations, the layers 12 can exhibit a high absorption of the solar radiation with wavelengths less than about 0.7 microns while the region 14 can exhibit a high absorption of the solar radiation with wavelengths in a range of about 0.7 microns to about 1 micron. The layer 16 can in turn show a high absorption of the solar radiation with wavelengths greater than about 1 micron, e.g., in a range of about 1 micron to about 2.5 microns. The term "high absorption" refers to an absorption of radiation with an absorptance greater than about 60%, or greater than about 70%, or preferably greater than about 80%, and more preferably greater than about 90% (e.g., near unity).

FIG. 3A shows a multijunction solar cell 24 that corresponds to an exemplary implementation of the aforementioned solar cell 10 in which each of the layers 10, 12 and 14 is formed primarily of silicon (that is, it is formed of silicon in which some dopants are incorporated). More specifically, the solar cell 24 includes a radiation transparent support substrate 26 that extends from an external surface 26a that is adapted for exposure to solar radiation to an internal surface 26b on which a layer of a transparent conductor 28 is disposed. In this embodiment, the substrate 26 is formed of glass, though in other embodiments it can be formed of other materials such as transparent dielectrics (e.g. quartz) or plastics or polymers. The radiation transparent conductor layer 28 can be formed, for example, of indium tin oxide (ITO) or zinc oxide (ZnO).

The exemplary multijunction solar cell 24 further includes a radiation-absorbing layer 30 formed of p-doped amorphous silicon (αSi) that is disposed over the transparent conductor layer 28. The layer 30 can exhibit a thickness in a range of about 1 nm to about 1000 nanometers, and preferably in a range of about 10 nm to about 100 nanometers (e.g., about 50 nm). The doping level of the layer 30 can be, e.g., in a range of about $10^{14}$ $cm^{-3}$ to about $10^{19}$ $cm^{-3}$, and preferably in a range of about $10^{16}$ $cm^{-3}$ to about $10^{17}$ $cm^{-3}$. The layer 30 can be doped with a variety of p-type dopants, such as boron or aluminum or gallium.

Another radiation absorbing layer 32 is disposed over the layer 30 to form a junction J1 therewith, where the junction includes a depletion region. More specifically, in some embodiments the layer 32 can be formed of crystalline silicon (c-Si) or polycrystalline silicon (p-Si) that is appropriately doped. In this exemplary implementation, the layer 32 comprises polycrystalline silicon that is doped with an n-type dopant. The doping concentration of the layer 32 can be, for example, in a range of about $10^{12}$ $cm^{-3}$ to about $10^{18}$ $cm^{-3}$, and preferably in a range of about $10^{14}$ $cm^{-3}$ to about $10^{16}$ $cm^{-3}$. Further, the thickness of the layer 32 can be in a range of about 1 micrometer to about 500 micrometers, and preferably in a range of about 5 micrometers to about 50 micrometers (e.g., about 10 microns). The contact junction J1 formed between the layers 30 and 32 includes a depletion region. As discussed in more detail below, an electric field in the depletion region can facilitate the separation of the electron-hole pairs generated in that region or in vicinity thereof by incident solar photons. In some implementations, the layer 32 can be a thin layer having a thickness, e.g., in a range of about 1 micrometer to about 10 micrometers. In some cases, such a thin layer (e.g., a thickness in a range of about 1 micron to about 10 microns) can exhibit an absorptance of about 25% or less in response to exposure to radiation wavelengths in a range of about 0.7 microns to about 1 micron.

In this embodiment, a thin highly-doped disordered layer 34 forms another junction J2 with the crystalline or polycrystalline layer 32 (in some other embodiments the heavily doped layer 34 can be crystalline exhibiting in some cases a highly ordered structure). Similar to the junction J1, the junction J2 can also include a depletion region that can facilitate the separation of electron-hole pairs generated by solar photons. As discussed in detail below, in some cases, the layer 34 can be fabricated by applying a plurality of short laser pulses to the top surface of the underlying layer 32 while exposing the surface to an electron-donating compound (e.g., $SF_6$). The layer 34 can have a thickness in a range of about 10 nm to about 1000 nm, and preferably in a range of about 50 nm to about 200 nm. In many implementations, the layer 34 includes a high level of n-doping (e.g., at an atomic concentration of at least about 1%) so as to exhibit a higher n-type doping concentration level than that of the underlying layer 32.

As discussed in more detail below, in this embodiment, the highly-doped silicon layer 34 can absorb radiation with wavelengths greater than about 1 micron (e.g., greater than about 1.1 microns) with an absorptance significantly greater than that exhibited by crystalline silicon at those wavelengths. While crystalline silicon exhibits a precipitous drop in radiation absorption for wavelengths greater than that corresponding to its bandgap (e.g., greater than about 1.1 microns), the highly-doped silicon layer can exhibit in some cases near unity absorptance (e.g., an absorptance greater than about 90%) for those radiation wavelengths.

Figure 4:
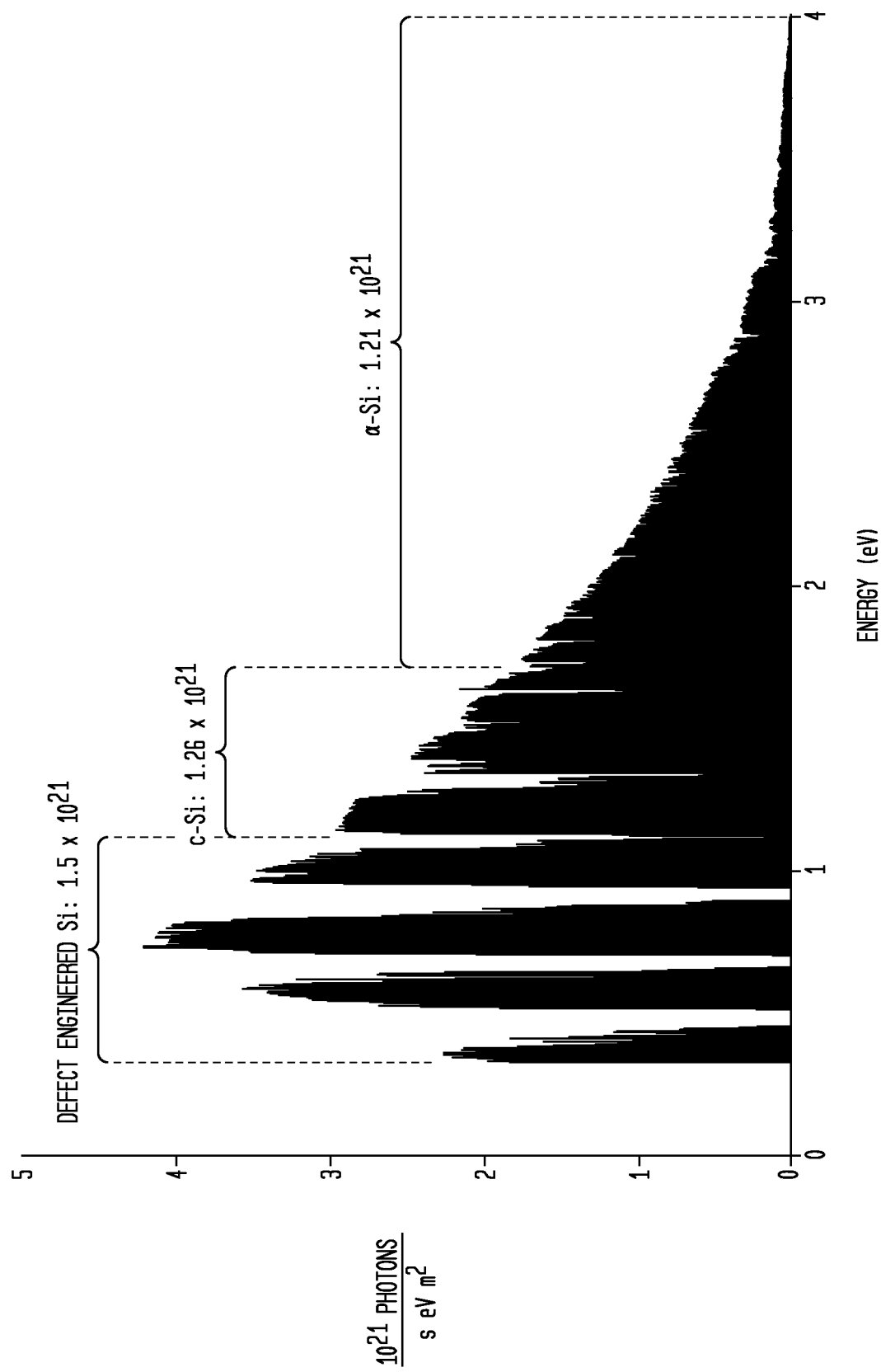
FIG. 4 depicts absorption of radiation by three layers of a hypothetical solar cell according to an embodiment of the invention over different wavelength ranges of the solar spectrum.

The absorption characteristics of the three layers 30, 32 and 34 in the exemplary multijunction solar cell 24 can allow the cell to absorb the incident solar photon flux over a wide wavelength range. By way of illustration, FIG. 4 shows a plot indicating the absorption of solar photons by different layers 30, 32, and 34 of a hypothetical implementation of the solar cell 24, illustrating the number of photons absorbed by each of those layers (it should be understood that this figure is presented only for illustrative purposes and is not intended to necessarily indicate the optimal radiation absorption characteristics of a multijunction solar cell in accordance with the teachings of the invention). The plot shows the photon flux (number of photons per unit area) at a given energy in the AM1.5 solar spectrum. The area under the curve represents the number of photons in a given energy range. The amorphous silicon layer can absorb photons with energies greater than about 1.7 eV, while the polycrystalline or crystalline silicon layer can absorb photons with energies greater than about 1.1 eV. The highly-doped disordered layer (in some cases the highly-doped layer is not disordered) can in turn absorb photons with energies greater than about 0.5 eV. In some cases, the highly-doped layer can absorb photons with energies greater than about 0.25 eV.

Referring again to FIG. 3A, a thin metallic layer 36 is disposed over the thin layer 34. The metallic layer 36 together with the aforementioned radiation transparent conductive layer 28 allow extracting a voltage from the solar cell 24 to be applied to an external load 38, as shown schematically in FIG. 3B, and discussed in more detail below.

In use, upon exposure of the multijunction solar cell 24 to solar radiation, incident solar photons pass through the glass substrate 26 and the transparent conductor to be incident on the amorphous silicon layer 30. A portion of these photons are absorbed by the amorphous silicon layer so as to generate electron-hole pairs. The photons absorbed by the amorphous layer 30 are typically high energy photons, e.g., photons having energies greater than an energy corresponding to the band gap of amorphous silicon (e.g., 1.7 eV).

The remaining photons, or at least a large portion of them, enter the polycrystalline (or crystalline) layer 32. These photons have typically lower energy as many of the higher energy photons were previously absorbed by the amorphous layer 30. For example, many of these photons can have energies in a range of about 1.1 eV to about 1.7 eV. The absorption of these photons can also lead to the generation of electron-hole pairs. Finally, those photons that were not absorbed by the layers 30 and 32 reach the highly-doped layer 34 and are absorbed by that layer (at least a portion of those photons are absorbed by the layer 34) to generate additional electron-hole pairs. The energies of many of these photons lie in a range less than about 1.1 eV. In many implementations, the layer 34 exhibits micron-sized surface undulations that can help in trapping photons. In addition, the metallic layer 36 can reflect photons not absorbed by the radiation absorbing layers back to those layers.

Figure 5:
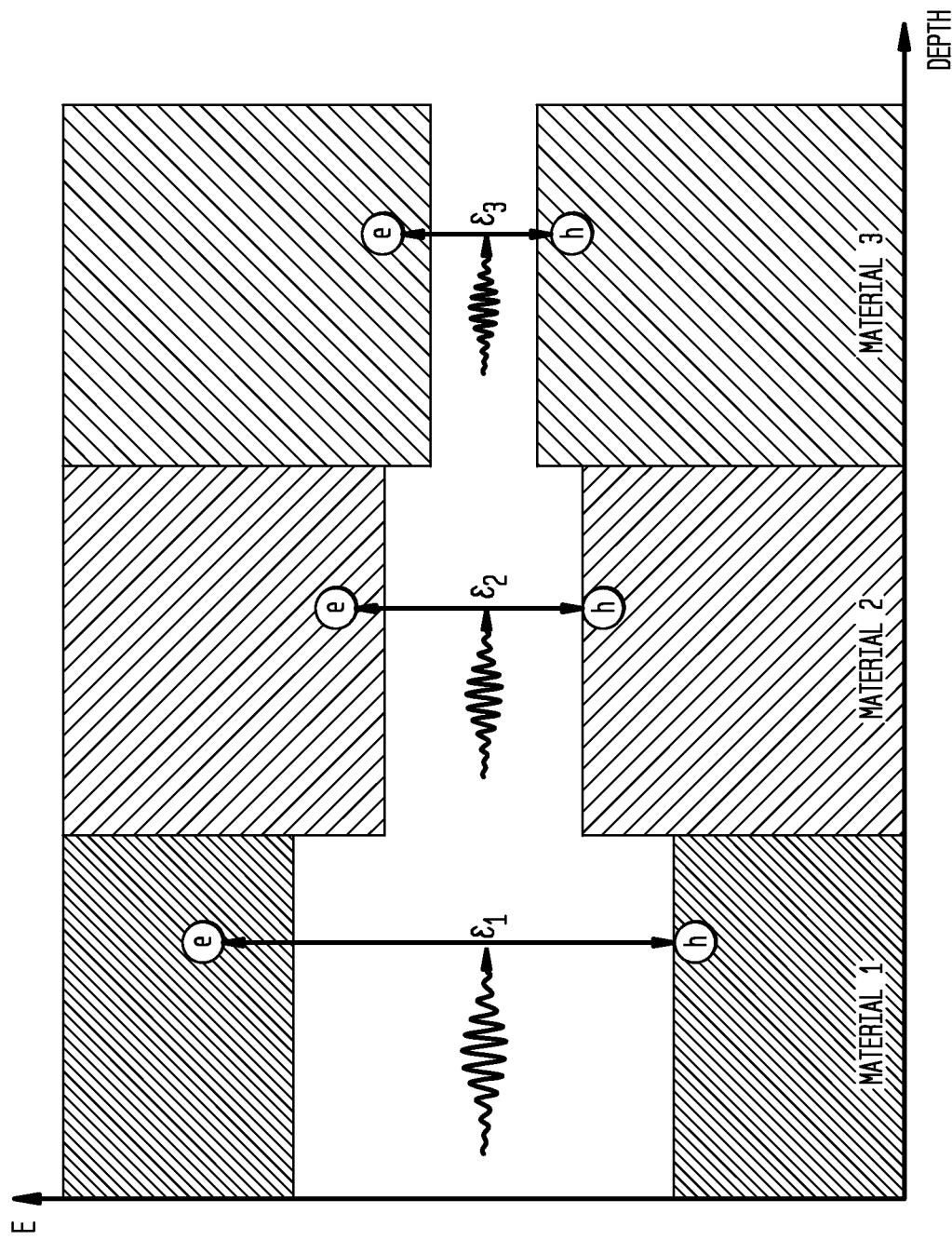
FIG. 5 depicts schematically absorption of photons in various layers of a solar cell according to an embodiment of the invention, FIG. 6A schematically depicts absorption of photons in a conventional homojunction solar cell, FIG. 6B schematically depicts the thermalization energy loss of an electron of an electron-hole pair generated in a conventional homojunction solar cell, FIG. 6C schematically depicts that absorption of a photon in conventional homojunction solar cell can yield work corresponding to the energy associated with the band gap, FIG. 7 schematically depicts depletion regions associated with junctions between various layers of a solar cell according to an embodiment of the invention.

Hence, the multijunction solar cell 24 absorbs photons over substantially the entire range of the solar radiation spectrum. Such absorption of photons corresponding to different wavelength ranges of the solar spectrum is schematically shown in a graph in FIG. 5 for a hypothetical multijunction solar cell according to the teachings of the invention. The graph schematically indicates each material with its associated band gap (for example, in the solar cell shown in FIG. 5, Material 1 corresponds to amorphous silicon, Material 2 corresponds to crystalline or polycrystalline silicon and Material 3 corresponds to a highly-doped disordered layer). The graph shows that the band gap of the three material progressively decreases such that the photons having higher energies are absorbed primarily in Material 1 to generate electron-hole pairs while lower energy photons are absorbed in the Materials 2 and 3 (in cases where a surface of Material 1 is exposed to solar radiation, high energy photons, which can be absorbed near the surface, can suffer less thermalization loss). Many device details, such as the bending of the bands at the junctions, are not shown in this figure.

Figure 6A:
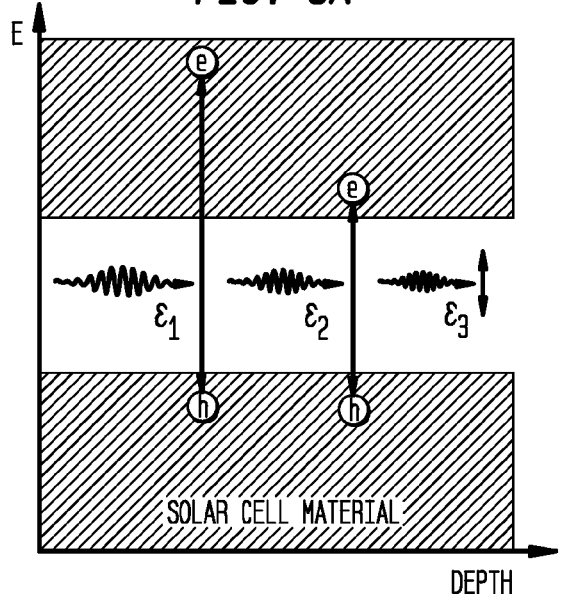
Figure 6B:
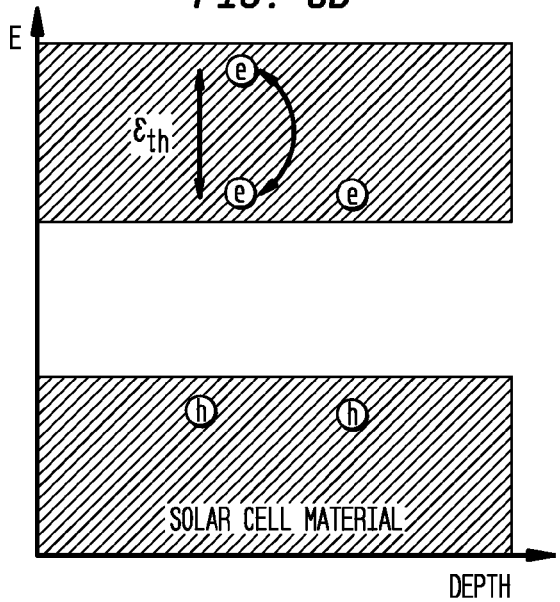
Figure 6C:
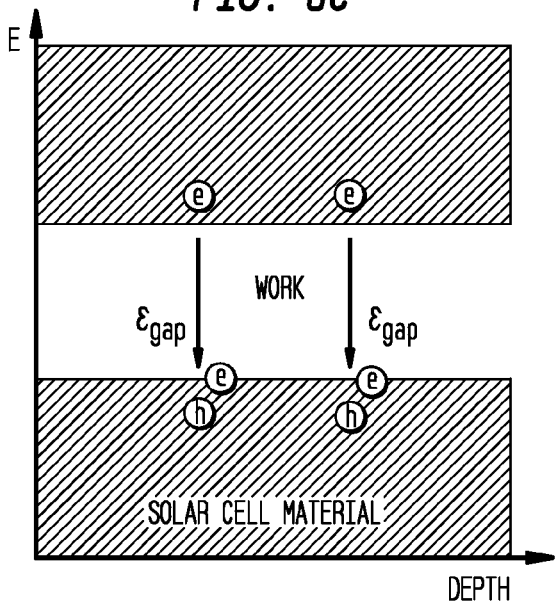

By way of contrast, FIGS. 6A-6C schematically show the absorption of solar photons in a hypothetical homojunction photovoltaic cell (e.g., a solar cell). FIG. 6A shows that only those photons having energies that are at least equal to that of the band gap can be absorbed. All absorbed photons yield about $\in_{gap}$ of work, as shown schematically in FIG. 6C. But many low energy photons are not absorbed. Further, some energy from high energy photons are lost to lattice thermalization (e.g., FIG. 6B schematically shows energy ($\in_{th}$) lost by an electron of an electron-hole pair generated by a high energy photon to the lattice). By way of example, in a near ideal silicon homojunction material, photons representing more than about 20% of the solar energy are not absorbed and about 30% of the energy of the absorbed photons is lost to heat.

Figure 7:
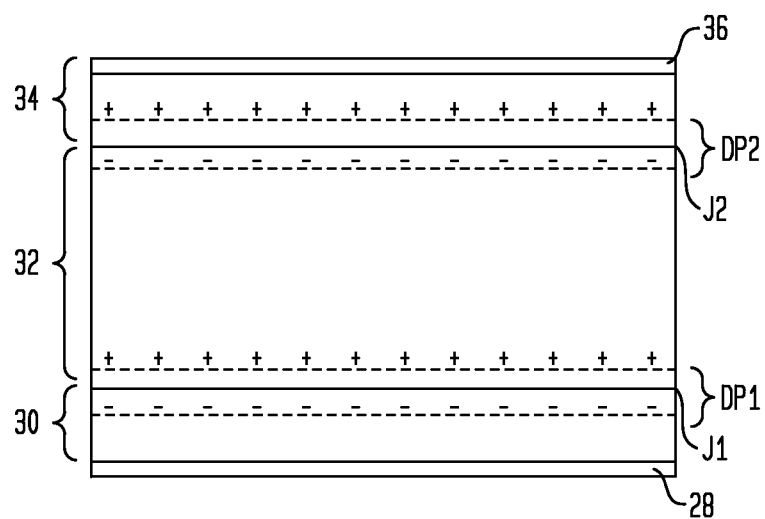

Referring again to FIG. 3A, the junctions J1 and J2 include depletion regions. These depletion regions are shown schematically in FIG. 7 as regions DP1 and DP2. The electron-hole pairs generated in each of the two depletion regions or in vicinity thereof are separated by the electric field present in the depletion regions to drift towards the upper or the lower conductors 36 and 28. Some of such electrons and holes are lost to electron-hole recombination events, while others are lost to non-radiative recombination at traps, and still others may be lost to Auger recombination. Those that reach the respective upper and lower metal electrodes can provide a voltage across the cell that can be applied to an external load, such as the light bulb shown in FIG. 3B.

In some embodiments, the highly-doped layer exhibits not only a high doping concentration level but also good charge carrier mobility so as to minimize electron-hole recombination events and scattering. By way of example, the electron mobility in the highly doped layer 34 can be greater than about 500 cm$^2$/V·s, e.g., in a range of about 100 cm$^2$/V·s to about 1000 cm$^2$/V·s. As discussed in more detail below, in some cases the fabrication of the highly-doped layer can include a high-temperature annealing protocol to ensure high electron mobility in that layer.

A variety of techniques can be employed to fabricate the multijunction solar cell 24. By way of example, in one such fabrication method, the transparent conductive electrode can be formed on a surface of glass substrate, e.g., by radio frequency sputtering from an indium tin oxide (ITO) target. Subsequently, the amorphous silicon layer can be grown on the exposed surface of the transparent metal electrode, in a manner known in the art, for example by decomposition of silane gas (SiH$_4$) in plasma enhanced chemical vapor deposition. Similarly, the crystalline or polycrystalline layer is grown on the amorphous layer. By way of example, thin films of amorphous and microcrystalline silicon can be produced by plasma-enhanced chemical vapor deposition using a mixture of silane (SiH$_4$) and hydrogen gases. The films can include a substantial amount of hydrogen (e.g., 5-20 at. %). Amorphous silicon films can be fabricated by utilizing pure silane while crystalline grains can be fabricated via high dilution in hydrogen. The degree of crystallinity can be varied by varying the concentration of silane, e.g., in a range of about 4.5% to about 8%. For example, in some cases, at a concentration of about 4.5%, the film can exhibit a high degree of crystallinity with an average grain size of, e.g., about 25 microns. Amorphous and microcrystalline silicon can be doped with a suitable n-type and p-type dopant, such as phosphorous or boron, during the deposition process. Polycrystalline films are also commonly grown via low-pressure chemical vapor deposition, via thermal decomposition of silane gas in a tube furnace.

The highly-doped layer 34 can then be generated by applying short radiation pulses to the exposed surface of the crystalline or polycrystalline layer 32 while the surface is exposed to an electron-donating compound (e.g., sulfur hexafluoride gas), as discussed in more detail below. It can also be generated via other techniques for implanting impurities beyond the solid solubility limit. Finally, the metallic electrode can be formed over the disordered layer 34, e.g., by evaporating a metal over that layer.

As discussed above, in this exemplary embodiment, the layer 34 is in the form of a disordered layer formed primarily of silicon in which a large quantity of an electron-donating dopant, e.g., sulfur, is incorporated. As noted in more detail below, such a layer can be formed by irradiating a silicon surface with short radiation pulses (e.g., pulses having temporal durations in a range of about 10 femtoseconds (fs) to about a few hundred nanoseconds) while exposing to the surface to an electron-donating constituent (e.g., $SF_6$). Such processing of silicon can generate the disordered layer 34 with a thickness, e.g., in a range of 10 nanometers to about 1000 nanometers, which exhibits not only significant absorption in the visible radiation wavelengths but also at wavelengths that are larger than that corresponding to the band gap of silicon (e.g., at wavelengths greater than about 1.1 microns).

By way of example, in some embodiments, the layer 34 can be fabricated by applying radiation pulses having temporal durations in a range of about 10 fs to about 500 fs (though longer pulse widths can also be utilized) and having wavelengths in a range of about 400 nm to about 800 nm to a surface of a crystalline silicon substrate; longer and shorter wavelengths can be used, for example from about 200 nm to wavelengths of several microns, e.g., 5 microns. The fluence (energy per unit area) of the pulses at the substrate surface can be, e.g., in a range of about 1 $kJ/cm^2$ to about 40 $kJ/cm^2$. In some cases, the substrate is moved relative to the radiation beam (or vice versa) such that different areas of the surface are irradiated with the pulses. The rate of movement of the substrate can be selected such that each irradiated area is exposed to a plurality of pulses, e.g., in a range of about a few tens to a few thousands (e.g., 500 pulses).

In some embodiments, the irradiation of the surface with the pulses is performed while the surface is exposed to a dopant chosen, e.g., from heavy chalcogens (e.g., sulfur, selenium, and tellurium). Without being limited to any particular theory, the train of the pulses can cause ultrafast melting of the substrate's lattice so as to yield a resolidification front that moves very fast, and can trap foreign atoms (e.g., sulfur) in its vicinity with a surface layer of the substrate at concentration levels that substantially exceed the respective solid solubility limit. These foreign atoms can be introduced in a variety of ways. For example, the substrate surface can be irradiated with the short (e.g., femtosecond) pulses while the surface is exposed to sulfur hexafluoride gas (e.g., the irradiation can be done in the presence of 500 torr sulfur hexafluoride gas). As another example, when doping the substrate with selenium or tellurium, a film of selenium or tellurium (e.g., a 100-nm film) can be thermally evaporated onto the substrate surface and then the coated surface can be irradiated with the short laser pulses.

Figure 8A:
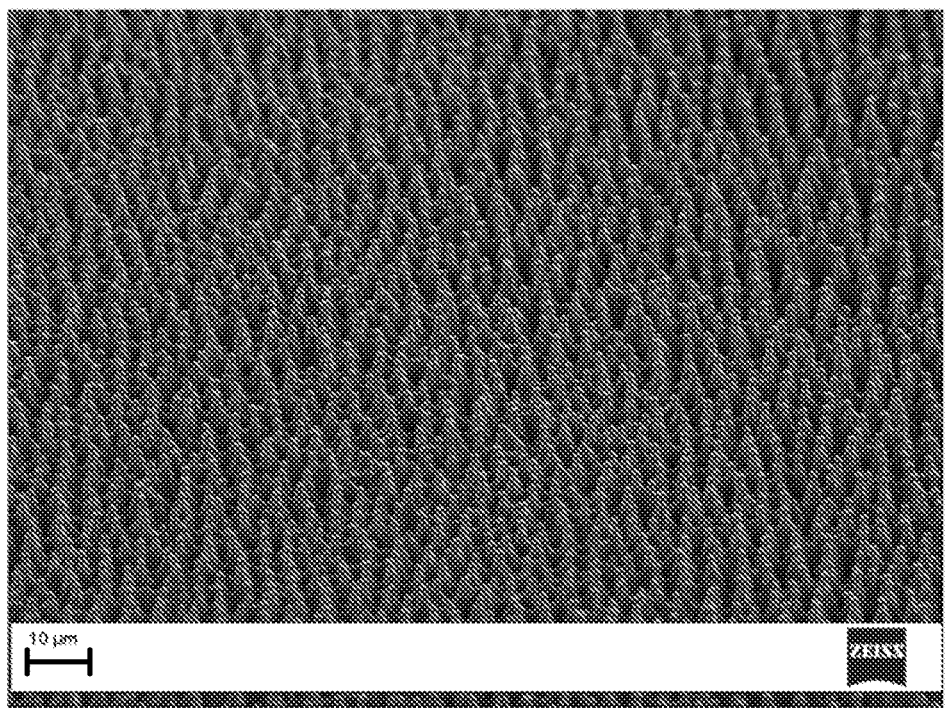
FIG. 8A shows surface structures generated in a silicon substrate via exposure of the substrate to femtosecond laser pulses in presence of $SF_6$.
Figure 8B:
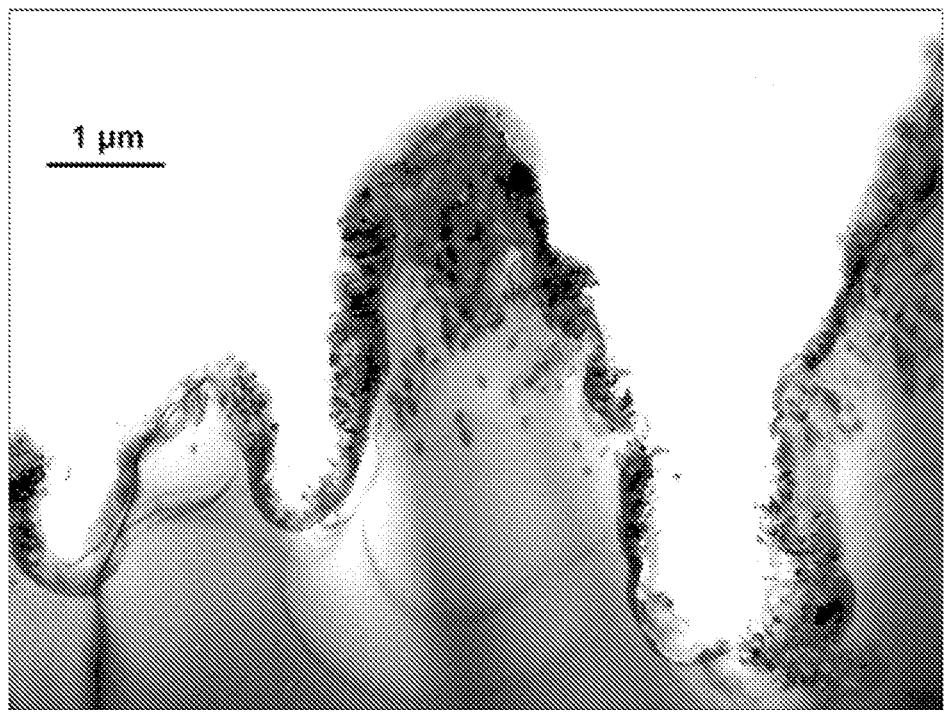
FIG. 8B is a cross-sectional TEM image of one of the spikes shown in FIG. 8A.

The resulting substrate surface can exhibit micron-scale or sub-micron scale morphologies depending on the conditions utilized. By way of example, FIG. 8A quasi-ordered array of microspikes that are about 1-15 microns tall and spaced by about 1-5 microns that were generated in a surface layer of a silicon substrate by exposing the surface to 100-fs laser pulses having a central wavelength of 800 nm and a fluence of about 8 $kJ/m^2$. Each area of the surface was exposed to about 600 pulses. A cross-sectional transmission electron microscopy (TEM) image of one of the spikes shown in FIG. 8B reveals a doped, 300-nm thick polycrystalline disordered surface layer. In particular, the X-ray diffraction pattern shown in the inset of FIG. 8B indicates that the disordered layer is in fact polycrystalline. Further, Rutherford backscattering data (not shown) indicates that the polycrystalline layer exhibits about 1% atomic doping, and diffraction studies reveal an average grain size of about 30 nm.

Further details regarding various ways of generating a doped surface layer by exposing a substrate surface to short laser pulses can be found U.S. Published Patent Application No. 2003/0029495 entitled "Systems and Methods for Light Absorption and Field Emission Using Microstructured Silicon," U.S. Published Patent Application No. 2006/0079062 entitled "Femtosecond Laser-Induced Formation of Submicrometer Spikes On a Semiconductor Substrate," U.S. Pat. No. 7,057,256 entitled "Silicon-based Visible and Near-infrared Optoelectronic Devices," pending U.S. patent application Ser. No. 12/038,209 entitled "Laser-Induced Structuring of Substrate Surfaces," each of which is herein incorporated by reference in its entirety. The present application also incorporates by reference a thesis entitled "Femtosecond Laser Ablation of Silicon: Nanoparticles, Doping and Photovoltaics," which was presented to Harvard University by Brian Tull in 2007.

The morphology of the disordered surface layer, e.g., characterized by a disordered array of microspikes, can be distinct from doping of the layer. For example, adjusting laser parameters (e.g., fluence) as well as the distribution of laser pulses over the surface can be employed to enhance or reduce the sizes of the surface features while still providing a requisite degree of doping (e.g., 1% atomic concentration). In some cases, the spikes or similar surface features generated by laser processing of the substrate can be used to amplify absorption of solar radiation incident on the surface due to multiple reflections. In other cases, it may advantageous to fabricate a highly doped disordered surface layer that exhibits a substantially smooth top surface. By way of example, an international (PCT) application entitled "Engineering Flat Surfaces on Material Doped Via Femtosecond Laser Irradiation", which is concurrently filed herewith and is herein incorporated by reference in its entirety, describes a method of processing a substrate by irradiating at least a portion of the substrate surface with a plurality of short radiation pulses while exposing the surface to a dopant. The pulses are selected to have a fluence at the substrate surface that is greater than a melting fluence threshold and less than an ablation fluence threshold. In this manner, a quantity of the dopant can be incorporated into the substrate while ensuring that the roughness of the substrate's surface is significantly less than the wavelength of the applied radiation pulses.

Although the above description relates to generating a highly doped layer in crystalline silicon, the methods discussed above can be employed to generate such doping layers in amorphous silicon (e.g., in thin films of amorphous silicon)

or other semiconductors by exposing them to short laser pulses in the presence of a dopant.

Figure 9:
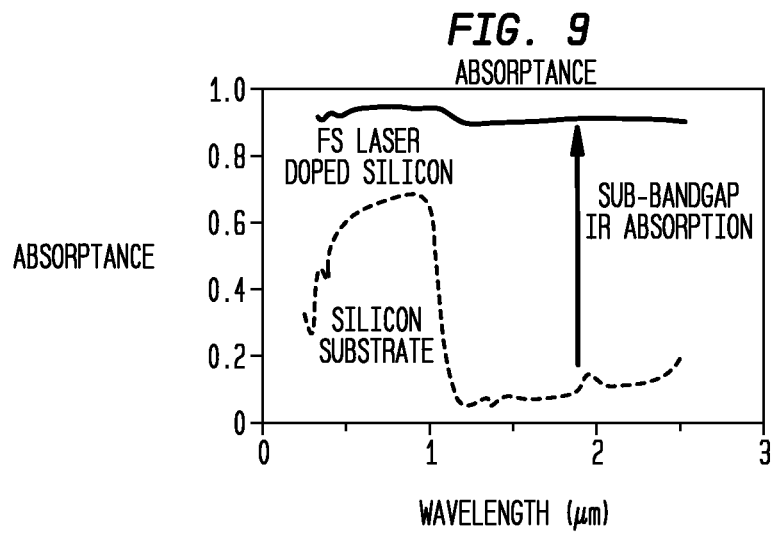
FIG. 9 shows radiation absorptance as a function of wavelength exhibited by a laser-processed silicon substrate relative to that exhibited by unstructured silicon.

The radiation absorbing layer 34 generated by the above methods can exhibit a substantially uniform absorption of electromagnetic radiation incident thereon from ultraviolet to the near-infrared (e.g., in a range of about 250 nm to about 2500 nm). As such, it can be particularly useful in absorbing the solar radiation at wavelengths greater than about 1.1 microns, where crystalline silicon shows very low absorption. By way of illustration, FIG. 9 shows the radiation absorptance as a function of wavelength for a highly doped surface layer formed in silicon via application of 100-fs pulses at a central wavelength of about 800 nm and a fluence of about 8 kJ/m² (each area was exposed to about 500 pulses), indicating a near-unity absorptance over a wide range of wavelengths. In contrast, as shown in the figure, the absorptance exhibited by a crystalline silicon substrate drops precipitously for wavelengths greater than about 1.1 microns.

Moreover, the highly-doped layer can form a diode junction with the underlying substrate that can be characterized by a depletion region. That is, in many cases, the dopant atoms are not only optically active but they can also act as electron donors. In some embodiments, subsequent to irradiation of substrate with laser pulses in the presence of a dopant, the substrate (and consequently the generated highly doped surface layer) is annealed at an elevated temperature (e.g., at 900 K for about 30 minutes) to facilitate the formation of a diode junction between the doped surface layer and the underlying substrate. Such an annealing step is further discussed in Published U.S. Patent Application No. 2008/0044943 entitled "Manufacture of Silicon-based Devices Having Disordered Sulfur-doped Surface Layers," which is incorporated herein by reference in its entirety.

Figure 10:
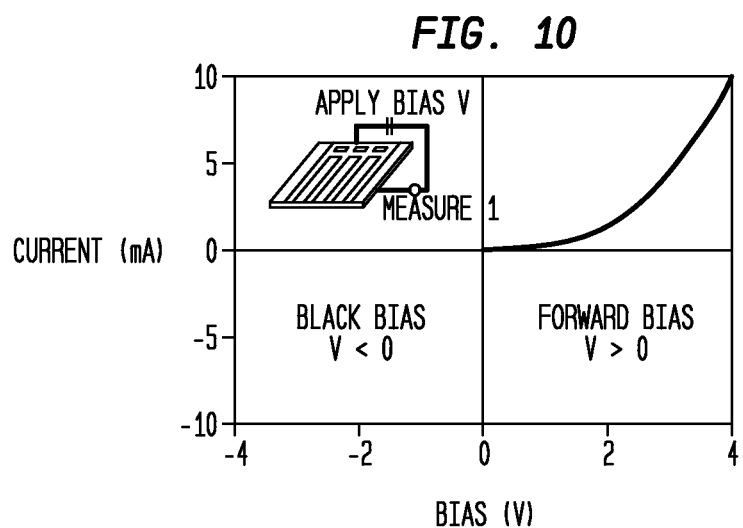
FIG. 10 shows rectification exhibited by a junction formed between a surface layer formed in silicon substrate by application of short laser pulses in presence of $SF_6$ and the underlying silicon substrate.

By way of illustration, FIG. 10 shows that a junction between a surface layer formed in a silicon substrate by application of 100-fs pulses (800 nm central wavelength at a fluence of 8 kJ/m²) and the underlying substrate demonstrates rectification. Additionally, regardless of the original substrate doping, room-temperature Hall measurements performed on a number of silicon substrates in which such highly doped surface layers are generated demonstrate a negative charge carrier concentration in a range of about $10^{19}$ to about $10^{20}$ cm$^{-3}$ in that layer.

A multijunction photovoltaic cell according to the teachings of the invention can provide a number of advantages relative to conventional multijunction photovoltaic cells. For example, a multijunction photovoltaic cell of the invention can utilize a significant portion of the solar wavelength spectrum for generating electron-hole pairs. In addition, it can be fabricated by utilizing abundant raw materials and known techniques. In contrast, conventional cells typically include a combination of exotic materials that are expensive, both to acquire as raw materials as well as to incorporate into a device.

The following example is provided for illustrative purposes to generally indicate the feasibility of utilizing a highly-doped disordered layer, such as the aforementioned layer 34, as a radiation absorbing layer in a multijunction solar cell.

Example

A homojunction prototype solar cell was fabricated by generating a highly doped disordered layer as a top surface layer of a p-type silicon substrate (resistivity ρ=800 Ohm-cm) by applying a plurality of 100-fs laser pulses having a central wavelength of 800-nm to a surface of the silicon substrate at a fluence of about 4 kJ/m² while exposing the surface to SF$_6$. Cr/Au electrical contacts were deposited, one on each opposed side of the substrate, to allow measuring a voltage generated across the cell in response to exposure to solar radiation.

Figure 11:
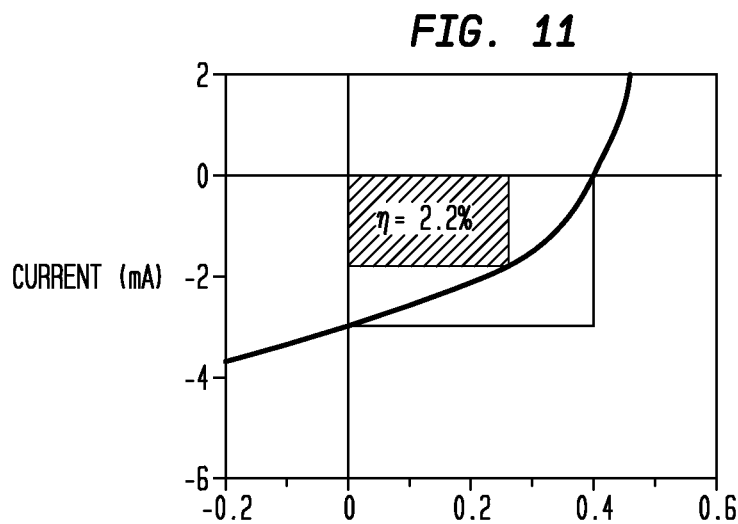
FIG. 11 shows I-V curve of a prototype solar cell.

FIG. 11 shows a current versus voltage (I-V) curve measured for the prototype homojunction cell. The open circuit voltage ($V_{oc}$) refers to a voltage developed across a solar cell, which is not connected to an external load, as a result of the electron-hole pairs generated in response solar radiation. The open circuit voltage can be measured, e.g., by determining a voltage needed to be applied to an illuminated solar cell to prevent flow of a current. The short circuit current ($I_{sc}$) refers to a current that flows through an external source having a vanishing resistance that is coupled across an illuminated cell. By way of example, the $V_{oc}$ and $I_{sc}$ can be determined by sweeping a voltage applied across A power delivered by a solar cell to an external load connected across the cell having a given resistance can be determined by multiplying the current through the load by the voltage across the load. A variable used to characterize the quality of a solar cell is known as the fill factor (FF), which can be defined as follows:

$$FF = \frac{I_{max}V_{max}}{I_{SC}V_{OC}} \quad \text{Eq. (2)}$$

where $I_{max}$ and $V_{max}$ correspond to current and voltage associated with a maximum power delivered by the cell, and $V_{oc}$ and $I_{sc}$ represent the open circuit voltage and short circuit current, respectively.

The efficiency of a solar cell, η (%), for converting solar power into electrical energy can be defined as:

$$\eta = \frac{I_{max}V_{max}}{T_1 A} \times 100\% \quad \text{Eq. (3)}$$

where $T_1$ represents the intensity of the light incident on the a surface of the cell exposed to the solar radiation, A represents the area exposed to the solar radiation, and $I_{max}$ and $V_{max}$ correspond to current and voltage associated with a maximum power delivered by the cell.

The efficiency of the aforementioned prototype cell under irradiation of an AM$_{1.5}$ solar spectrum was measured to be about 2.2% with an open circuit voltage of about 0.42 V, a short circuit current of 14.4 mA/cm², and a fill factor of about 0.36.

Those having ordinary skill in the art will appreciate that various changes can be made to the above embodiments without departing from the scope of the invention.

The invention claimed is:
1. A photovoltaic device, comprising
a first doped silicon layer generated by irradiating a silicon surface with short radiation pulses while exposing the surface to a dopant,
a second doped silicon layer forming a first junction with said first layer, and
a third doped silicon layer forming a second junction with said second layer,
each of said layers exhibiting an absorptance greater than about 60% for radiation in a different wavelength range of the solar spectrum so as to generate electron-hole pairs, wherein said first layer is capable of absorbing radiation at one or more wavelengths greater than about 1 micron with an absorptance greater than about 60%; and a transparent conductor layer adapted for exposure to external radiation, wherein said second doped silicon layer is capable of absorbing radiation at wavelengths in a range of about 0.7 microns to about 1.1 microns, and wherein said third doped silicon layer is capable of absorbing radiation at wavelengths in a range of about 0.25 microns to about 0.7 microns.

2. The photovoltaic device of claim 1, wherein said wavelength ranges corresponding to absorption by the layers collectively span a wavelength range extending from about 250 nm to about 2500 nm.

3. The photovoltaic device of claim 1, wherein said first layer exhibits an absorptance greater than about 70% for one or more wavelengths greater than about 1 micron.

4. The photovoltaic device of claim 1, wherein said first layer exhibits an absorptance greater than about 80% for one or more wavelengths greater than about 1 micron.

5. The photovoltaic device of claim 1, wherein said first layer exhibits an absorptance greater than about 90% for one or more wavelengths greater than about 1 micron.

6. The photovoltaic device of claim 1, wherein one of said layers comprises amorphous silicon.

7. The photovoltaic device of claim 1, wherein one of said layers comprises any of crystalline or polycrystalline silicon.

8. The photovoltaic device of claim 1, wherein said first layer comprises a dopant at an atomic concentration greater than about 1%.

9. A photovoltaic device, comprising
a first radiation absorbing femtosecond laser doped silicon layer configured to absorb electromagnetic radiation at one or more wavelengths greater than about 1 micrometer with an absorptance greater than about 70%,
a second radiation absorbing layer formed of any of doped crystalline or polycrystalline silicon disposed over said first layer, said second layer forming a first junction with said first layer, and
a third radiation absorbing layer formed of doped amorphous silicon disposed on said second layer so as to form a second junction therewith, and
a transparent conductor layer adapted for exposure to external radiation,
wherein said third radiation absorbing layer that is formed of doped amorphous silicon is disposed over said transparent conductor layer to receive at least a portion of external radiation incident on said transparent conductor layer, and
wherein said layers are collectively capable of absorbing radiation wavelengths over a range extending from about 250 nm to about 2500 nm,
wherein said second doped silicon layer is capable of absorbing radiation at wavelengths in a range of about 0.7 microns to about 1.1 microns, and
wherein said third doped silicon layer is capable of absorbing radiation at wavelengths in a range of about 0.25 microns to about 0.7 microns.

10. The photovoltaic device of claim 9, wherein said first layer comprises a layer containing said dopant with an atomic concentration greater than about 1%.

11. The photovoltaic device of claim 9, wherein said first layer has a thickness in a range of about 10 nm to about 1000 nm.

12. The photovoltaic device of claim 9, further comprising a pair of electrodes one of which is in electrical coupling with said first layer and another with said third layer so as to facilitate generation of an electrical signal in response to exposure of said transparent conductor layer to said external radiation.

13. The photovoltaic device of claim 12, wherein said electrical signal comprises any of a voltage or a current.

14. The photovoltaic device of claim 9, wherein said first layer includes an n-type dopant.

15. The photovoltaic device of claim 9, wherein said first layer exhibits an electron mobility greater than about 100 cm$^2$/Vs.

16. The photovoltaic device of claim 9,
wherein said layers are adapted to collectively absorb at least about 70% of solar radiation energy incident on said transparent conductor layer.

17. The photovoltaic device of claim 16, wherein said layers are adapted to collectively absorb at least about 80% of solar radiation energy incident on said transparent conductor layer.

18. The photovoltaic device of claim 16, wherein said layers are adapted to collectively absorb at least about 90% of solar radiation energy incident on said transparent conductor layer.

19. The photovoltaic device of claim 1, wherein at least one of said first and second junctions is characterized by a depletion region.

20. The photovoltaic device of claim 1, wherein each of said first and second junctions is characterized by a depletion region.

21. The photovoltaic device of claim 1, wherein said wavelength ranges corresponding to absorption by the layers collectively span a wavelength range extending from about 250 nm to about 1100 nm.

22. The photovoltaic device of claim 1, wherein at least one of said layers comprises microcrystalline silicon.

23. The photovoltaic device of claim 9, wherein at least one of said first and second junctions is characterized by a depletion region.

24. The photovoltaic device of claim 9, wherein each of said first and second junctions is characterized by a depletion region.

25. The photovoltaic device of claim 16, wherein at least one of said first and second junctions is characterized by a depletion region.

26. The photovoltaic device of claim 16, wherein each of said first and second junctions is characterized by a depletion region.

27. The photovoltaic device of claim 1,
wherein said at least one layer capable of absorbing radiation at one or more wavelengths in a range of about 1 micron with an absorptance greater than about 60% is a disordered layer characterized by micron-scale or submicron scale undulating morphologies for enhancing absorption of incident radiation.

28. The photovoltaic device of claim 27, wherein at least one of said first and second junctions is characterized by a depletion region.

29. The photovoltaic device of claim 27, wherein said undulating morphologies comprise a plurality of surface features.

30. The photovoltaic device of claim 27, wherein said undulating morphologies enhance the absorption of incident radiation by causing the radiation to undergo multiple reflections.

31. The photovoltaic device of claim 27, where at least a portion of at least one of said layers is configured for exposure to an external source of radiation.

32. The photovoltaic device of claim 31, wherein at least one of said layers is capable of generating electron-hole pairs in response to incident radiation having one or more wavelengths within the solar wavelength spectrum.

33. The photovoltaic device of claim 32, further comprising a pair of electrodes one of which is in electrical coupling with one of said layers and the other is in electrical coupling with another one of said layers to facilitate generation of an electrical signal in response to the generation of said electron-hole pairs.

34. The photovoltaic device of claim 1, wherein said first layer has a thickness in range of about 10 nanometers to about 500 nanometers.

35. The photovoltaic device of claim 34, wherein said second layer has a thickness in a range of about 5 microns to about 50 microns.

36. The photovoltaic device of claim 35, wherein said third layer has a thickness in a range of about 10 nm to about 1000 nm.

37. The photovoltaic device of claim 36, wherein said third layer includes a concentration of an n-type dopant of at least about 0.1%.

38. The photovoltaic device of claim 37, wherein said concentration of the n-type dopant is in a range of about 0.1% to about 2%.

39. The photovoltaic device of claim 38, wherein said third layer exhibits an absorptance greater than about 90% for one or more radiation wavelengths greater than about 1 micron.

40. The photovoltaic device of claim 39, wherein said first layer is a p-doped layer of amorphous silicon.

41. The photovoltaic device of claim 40, wherein said second layer is an n-doped layer of crystalline or polycrystalline silicon.

42. The photovoltaic device of claim 1, wherein said short radiation pulses have a duration in a range of about 100 femtoseconds to a few hundred nanoseconds.

43. The photovoltaic device of claim 1, wherein said short radiation pulses have a duration in a range of about 100 femtoseconds to about 500 femtoseconds.

44. The photovoltaic device of claim 1, wherein said dopant comprises an electron-donating constituent.

* * * * *